US00RE39241E

(19) United States
(12) Reissued Patent
Fosnight

(10) Patent Number: US RE39,241 E
(45) Date of Reissued Patent: Aug. 22, 2006

(54) MODULAR SMIF POD BREATHER, ADSORBENT, AND PURGE CARTRIDGES

(75) Inventor: William J. Fosnight, Carlisle, MA (US)

(73) Assignee: Entegris, Inc., Chaska, MN (US)

(21) Appl. No.: 10/718,512

(22) Filed: Nov. 20, 2003

Related U.S. Patent Documents

Reissue of:
(64) Patent No.: 6,319,297
Issued: Nov. 20, 2001
Appl. No.: 09/049,354
Filed: Mar. 27, 1998

(51) Int. Cl.
*B01D 46/02* (2006.01)
*B65G 49/07* (2006.01)
*B65D 85/86* (2006.01)

(52) U.S. Cl. ..... 55/318; 55/422; 55/482; 141/98; 414/291; 414/935; 414/937; 206/710

(58) Field of Classification Search ..... 210/318, 210/320, 328, 385.2, 401, 417, 419, 420, 210/422, 482; 141/98; 414/291, 935, 937, 414/940; 454/187; 206/710–712
See application file for complete search history.

(56) References Cited

U.S. PATENT DOCUMENTS 3,715,972 A * 2/1973 Kelso et al. ..... 454/61
3,975,995 A * 8/1976 Shuler ..... 454/296
4,062,781 A * 12/1977 Strauss et al. ..... 210/446
4,064,876 A * 12/1977 Mulchi ..... 128/206.15
4,129,145 A * 12/1978 Wynn ..... 137/541
4,461,205 A * 7/1984 Shuler ..... 454/294
4,532,970 A * 8/1985 Tullis et al. ..... 414/217.1
4,534,389 A * 8/1985 Tullis ..... 414/217.1
4,666,479 A * 5/1987 Shoji ..... 55/385.4
4,724,874 A * 2/1988 Parikh et al. ..... 141/98
4,804,086 A * 2/1989 Grohrock ..... 206/710
5,058,491 A * 10/1991 Wiemer et al. ..... 454/187
5,095,927 A * 3/1992 Thompson et al. ..... 134/102.1
5,114,572 A * 5/1992 Hunter et al. ..... 210/120
5,124,856 A * 6/1992 Brown et al. ..... 360/97.03
5,195,922 A * 3/1993 Genco ..... 454/57
5,219,464 A * 6/1993 Yamaga et al. ..... 96/402
5,297,990 A * 3/1994 Renz et al. ..... 454/187
5,346,518 A * 9/1994 Baseman et al. ..... 96/126
5,350,336 A * 9/1994 Chen et al. ..... 454/187
5,401,212 A * 3/1995 Marvell et al. ..... 454/187
5,431,599 A * 7/1995 Genco ..... 454/187
5,514,196 A * 5/1996 Tanahashi et al. ..... 55/324
5,740,845 A * 4/1998 Bonora et al. ..... 141/292
5,873,468 A * 2/1999 Ejima et al. ..... 206/711
5,879,458 A * 3/1999 Roberson et al. ..... 118/715
5,988,233 A * 11/1999 Fosnight et al. ..... 141/63
6,032,802 A * 3/2000 Ejima et al. ..... 206/711
6,521,007 B1 * 2/2003 Tanaka et al. ..... 55/385.2

* cited by examiner

*Primary Examiner*—Fred G. Prince
(74) *Attorney, Agent, or Firm*—Patterson, Thuente, Skaar & Christensen, P.A.

(57) ABSTRACT

Modular cartridges which may be inserted into and removed from a well or receptacle on the bottom of a pod. The cartridges may be configured to include various types and combinations of valves, filters, and/or conditioning agents. A standalone cartridge replacement station may be provided for inserting and removing various cartridges from one or more of the receptacles on the bottom of a pod while wafers are seated within the pod. The standalone replacement unit may decouple an existing cartridge from the pod by rotating the cartridge from a locked to an unlocked position and then lowering the cartridge out of the pod. Thereafter, the replacement station may insert a new cartridge up into the appropriate receptacle and rotate the cartridge into a locked position in the pod.

30 Claims, 4 Drawing Sheets

MODULAR SMIF POD BREATHER, ADSORBENT, AND PURGE CARTRIDGES

Matter enclosed in heavy brackets [ ] appears in the original patent but forms no part of this reissue specification; matter printed in italics indicates the additions made by reissue.

CROSS REFERENCE TO RELATED APPLICATIONS

The present application is related to the following United States Patent Applications, which applications are owned by the assignee of the present invention and which applications are hereby incorporated by reference in their entirety:

U.S. Pat. No. 6,164,554 entitled "Kinematic Coupling Compatible, Passive Interface Seal", filed Mar. 27, 1998, which application is currently pending; and U.S. Pat. No. 5,988,233, entitled "Evacuation-Driven SMIF Pod Purge System", filed Mar. 27, 1998, which application is currently pending.

BACKGROUND OF THE INVENTION

1. Field of the Invention

The present invention relates to SMIF pods, and more particularly to a system including modular cartridges having breather filters, adsorbent media, and/or check valves, which cartridges may be removably inserted into a well in a bottom surface of a SMIF pod.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) Surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING" by Mihir Parikh and Ulrich Kaempf, Solid State Technology, Jul. 1984, pp. 111–115.

Systems of the above type are concerned with particle sizes which range from below 0.02 microns (μm) to above 200 μm. Particles with these sizes can be very damaging in semiconductor processing because of the small geometries employed in fabricating semiconductor devices. Typical advanced semiconductor processes today employ geometries which are one-half μm and under. Unwanted contamination particles which have geometries measuring greater than 0.1 μm substantially interfere with 1 μm geometry semiconductor devices. The trend, of course, is to have smaller and smaller semiconductor processing geometries which today in research and development labs approach 0.1 μm and below. In the future, geometries will become smaller and smaller and hence smaller and smaller contamination particles become of interest.

In practice, a SMIF pod is set down on various support surfaces within a wafer fab, such as for example at a load port to a minienvironment, whereupon interface mechanisms in the load port open the pod door to allow access to the wafers within the pod. Additionally, a pod may be supported at a storage location while awaiting processing at a particular tool. Such storage locations may comprise a local tool buffer in the case of metrology or high throughput tools, or may alternatively comprise a stocker for storing large numbers of pods within a tool bay.

Whether a tool load port, local tool buffer, stocker or stand alone purge station, the support surfaces typically include registration or kinematic pins protruding upward from the support surface. In 200 mm pods, the support surface includes registration pins, and guide rails which guide the pod into the proper rotational and translational position onto the pins. In 300 mm pods, a bottom surface of the pods includes radially extending grooves for receiving the pins. Once the pod is positioned so that the grooves are mounted over their respective kinematic pins, the grooves settle over the pins to establish six points of contact between the pod and support platform (at the grooves and pins) to kinematically couple the pod to the support platform with fixed and repeatable accuracy. Such a kinematic coupling is for example disclosed in U.S. Pat. No. 5,683,118, entitled "Kinematic Coupling Fluid Couplings and Method", to Slocum, which patent is hereby incorporated by reference herein in its entirety. The size and location of the kinematic pins are standardized so that the pods of various suppliers are compatible with each other. The industry standard for the location and dimensions of the kinematic coupling pins are set by Semiconductor Equipment and Materials International ("SEMI").

Occasionally, it is advantageous to purge a pod of contaminants and/or particulates by creating a current flow through a pod to carry away the contaminants and/or particulates. It may also be beneficial to fill a pod with a non-reactive gas for longer term storage and certain processes. Additionally it may be advantageous on occasion to provide the pod with a pressure higher or lower than ambient. In order to accomplish such purging, it is known to provide one or more valves within a pod which allow fluid flow to and/or from the interior of the pod. Inlet valves to the pod may be connected to a pressurized gas source to fill the pod with a desired gas, and outlet valves may be connected to a vacuum source to remove gas from the pod. The inlet and outlet valves may be used to purge the pod, including filling the pod with a desired gas, or raising/lowering the pressure within the pod. Such a system is disclosed in U.S. Pat. No. 4,724,874, entitled "Sealable Transportable Container Having a Particle Filtering System", to Parikh et al., which patent is assigned to the owner of the present application, and which patent is hereby incorporated by reference in its entirety. Relative to systems which require opening of the pod for purging valve systems require less components and space, and in general operate more efficiently.

In conventional purging systems, the gas flow lines terminate at the support surface at hollow pins that protrude above the support surface, which pins are received in the valves when the pod is placed on the support surface. An interface seal in the form of an elastic member is typically provided between the flow pin and valve to ensure a tight fit of the flow pin with respect to the valve. It is important that such interface seals provide a tight fit, and be durable to ensure that the tight fit does not deteriorate with use.

As gas flowing into a pod will be in contact with the exposed wafers, such gas is typically filtered before entry into a pod. For example, it is known to provide breather filters, such as for example high efficiency submicron particle filtering TEFLON® membranes for filtering gas injected or diffusing into a pod to remove particulates from the gas flow stream. Moreover, as the components and/or wafers within the SMIF pod may generate contaminants through outgassing, it is further known to provide adsorbent filters, such as for example those containing activated carbon, within the pod to absorb contaminants diffusing around the interior of the pod. Examples of various filters are disclosed in U.S. Pat. No. 5,346,518 entitled "Vapor Drain System", to Baseman et al., and U.S. Pat. No. 4,724,874 entitled "Sealable Transportable Container Having a Particle Filtering System", to Parikh et al., which patents are incorporated by reference herein in their entirety. It is further known to provide a conditioning agent within a pod, such as for example those which emit vapors that reduce corrosion and/or electrostatic charges within the pod.

SMIF pods may carry a variety of different substrates at different times, and may transport the substrates to a variety of different process stations. It may be advantageous to condition the gas within the pod, both with respect to composition and pressure, differently for the various substrates and/or processes. For example, certain processes may be more sensitive to certain particulates and contaminants. For such processes, a particular type of breather filter, adsorbent filter and/or a conditioning agent may be preferred. Additionally, it may be necessary to utilize a particular type of valve for a particular process or for a particular type of gas flow/removal system in the support surface. For example, some valves must be actuated by a pin in the port before gas is allowed to pass therethrough. Still others are self-actuating. Different types of valves are disclosed in U.S. Pat. No. 4,129,145 to Wynn, entitled "Check Valve Assembly", which reference is incorporated herein in its entirety. An additional type of valve is disclosed in U.S. Pat. No. 5,988,233, previously incorporated by reference. There may additionally be processes for which it is necessary to completely block off one or more of the inlet or outlet positions in a pod. Further complicating the problem is that it may be necessary to utilize a particular type of valve with a particular type of filter, and/or with a particular type of conditioning agent.

Cost and space considerations have to this point prevented wafer fabs from stocking SMIF pods with all combinations of valves, filters and/or conditioning agents. Aside from the vast expense of providing the necessary number of pods having each such combination, the majority of such pods would sit idle and would take up valuable storage space in a cleanroom environment.

While it is conceivable that an individual pod may be altered to include the desired valves, filters, and/or conditioning agents, such a process at present would require each of the wafers within a pod to be removed from the pod while the necessary pod configuration is manually assembled. Moreover, filters used in pods become ineffective when clogged with particulates and/or contaminants. Again, these filters may be removed and replaced by new ones. At present, such processes for removing and replacing components are time consuming, labor intensive, and require hardware for transferring and storing the wafers while the components are being changed.

SUMMARY OF THE INVENTION

It is therefore an advantage of the present invention to provide a system of modular cartridges comprising various combinations of valves, filters, and/or conditioning agents which may be easily and quickly inserted into and removed from a pod.

It is another advantage of the present invention to allow a cartridge with a particular valve, filter, and/or conditioning agent configuration to be removed from and loaded into a pod without having to remove the wafers from the pod.

It is a still further advantage of the present invention to provide the ability to include any combination of valve, filter, and/or conditioning agent within a pod in an economical, time and space efficient system.

It is another advantage of the present invention to be able to replace a used filter with a fresh filter in an economical, time and space efficient system.

These and other advantages are provided by the present invention which in preferred embodiments relates to modular cartridges which may be inserted into and removed from a well or receptacle on the bottom of a pod. The cartridges may be configured to include various types and combinations of valves, filters, and/or conditioning agents. For example, in one such embodiment, a cartridge may include a breather filter in a lower portion of a cartridge for filtering gas received from an inlet source, a check valve in a central portion of the cartridge for allowing one way flow of gas into the pod, and an adsorbent filter in a top portion of the cartridge for absorbing molecular particulates and/or contaminants floating around within the pod. Such a cartridge may or may not additionally include conditioning agents adjacent a top portion of the cartridge for conditioning the environment within the pod.

In preferred embodiments of the invention, a standalone cartridge replacement station may be provided for inserting and removing various cartridges to and from one or more of the receptacles on the bottom of a pod while wafers are seated within the pod. The standalone replacement station may decouple an existing cartridge from the pod by rotating the cartridge from a locked to an unlocked position and then lowering the cartridge out of the pod. Thereafter, the replacement station may insert a new cartridge up into the appropriate receptacle and rotate the cartridge into a locked position in the pod.

Additionally and/or alternatively, a cartridge including an adsorbent may be baked out, or recharged, upon removal of the cartridge, and the cartridge including the recharged adsorbent may be replaced into that or a subsequent pod.

BRIEF DESCRIPTION OF THE DRAWINGS

The present invention will now be described with reference to the figures in which.

DETAILED DESCRIPTION

The present invention will now be described with reference to FIGS. 1–8 which in general relate to a cartridge including various configurations of valves, filters, and/or conditioning agents, which cartridge may be inserted into and removed from a receptacle on a bottom portion of a SMIF pod. It is understood that the cartridges according to the present invention may be utilized with pods of various sizes including 200 mm and 300 mm pods. Moreover, it is understood that the contents of the pods are not critical to the present invention and may include such substrates as semiconductor wafers, reticles, and flat panel displays. It is further understood that the present invention complies with and allows compliance with all applicable SEMI standards.

Figure 1:
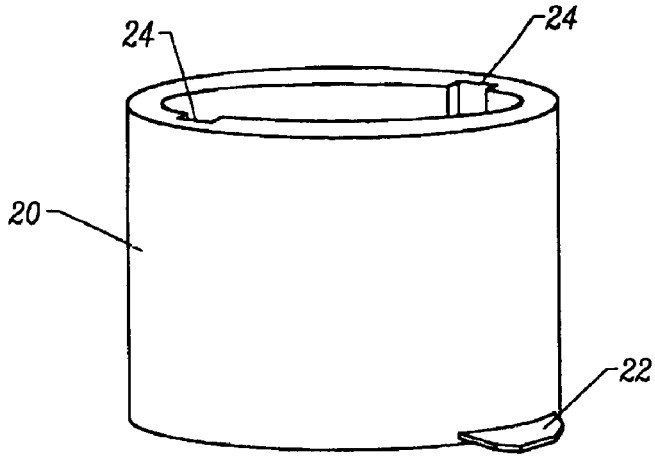
FIG. 1 is a perspective exterior view of a cartridge according to the present invention.
Figure 2:
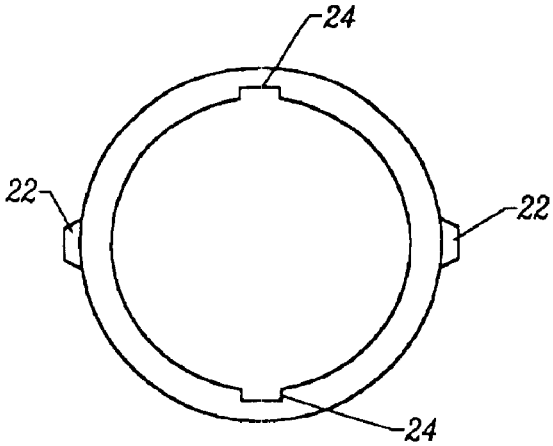
FIG. 2 is a top view of a cartridge according to the present invention.

Referring now to FIGS. 1 and 2, there is shown external perspective and top views, respectively, of a cartridge 20 according to the present invention. The outer housing of the cartridge 20 is preferably formed of a stable, rigid and lightweight substance such as polycarbonate. Other materials such as for example aluminum or various polymers are contemplated. As shown in FIGS. 1 and 2, the exterior cartridge 20 preferably includes a pair of wings 22 for locking the cartridge 20 in position within a pod, and a pair of key slots 24 capable of receiving a pair of keys (FIGS. 7 and 8) to rotate the cartridge 20 into and out of its locked position.

Figure 3:
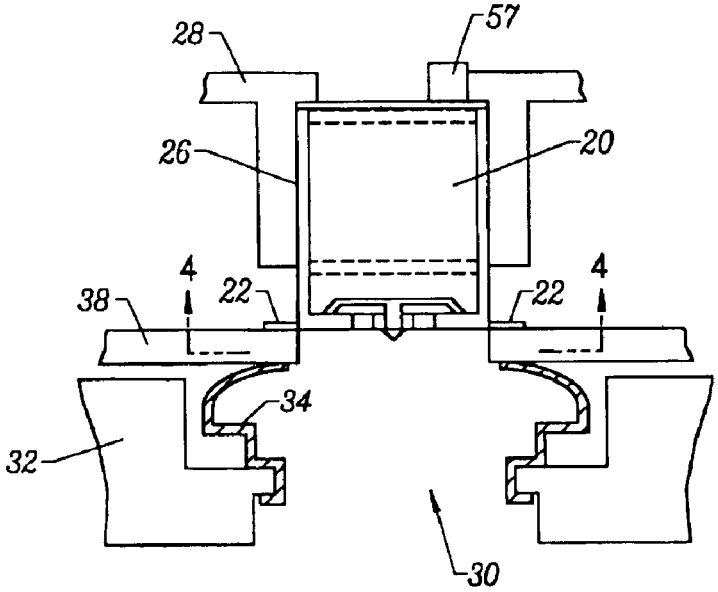
FIG. 3 is a front view of a cartridge according to the present invention mounted within a pod receptacle adjacent a support surface.

Referring now to FIG. 3, the cartridge 20 preferably fits within a receptacle 26 formed within a bottom surface of a pod 28. Cartridge 20 as well as receptacle 26 is preferably annularly shaped, but the shape of the cartridge 20 and receptacle 26 may vary together in alternative embodiments. The height and diameter of cartridge 20 are provided so as to fit snugly within receptacle 26 and may for example be 30 mm and 25 mm, respectively.

As shown in FIG. 3, when mounted within receptacle 26, the cartridge 20 lays over an inlet or outlet hole 30 formed within a support surface 32 on which the pod 28 may be mounted. As described in the Background of the Invention section, the support surface 32 and pod 28 may include registration pins and holes, respectively, for positioning 200 mm pods on the support surface. Alternatively, support surface 32 and pod 28 may include kinematic pins and grooves, respectively, for positioning 300 mm pods on the support surface 32. It is understood that the configuration and type of support surface 32 is not critical to the present invention and may vary in alternative embodiments. The inlet/outlet hole 30 preferably includes an interface seal 34 for ensuring that gas flows through the cartridge 20 and inlet/outlet hole 30 without escaping between the support surface and pod. Various configuration of interface seal 34 are disclosed in U.S. Pat. No. 6,164,554, which application has been previously incorporated by reference. It is understood that the configuration of interface seal 34 may vary in alternative embodiments. It is additionally contemplated that the cartridge 20 according to the present invention may operate with a conventional fluid flow pin protruding upward from support surface 32 in alternative embodiments.

Figure 4:
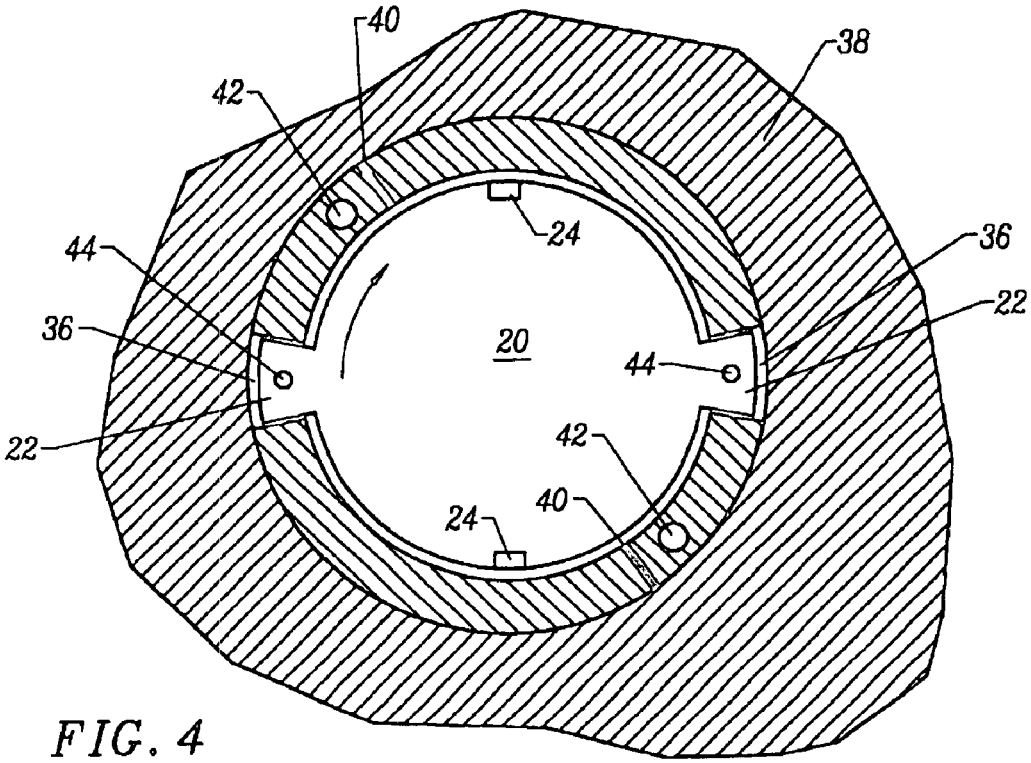
FIG. 4 is a cross-sectional view through line 4—4 of FIG. 3 showing a cartridge according to the present invention in an unlocked position.
Figure 5:
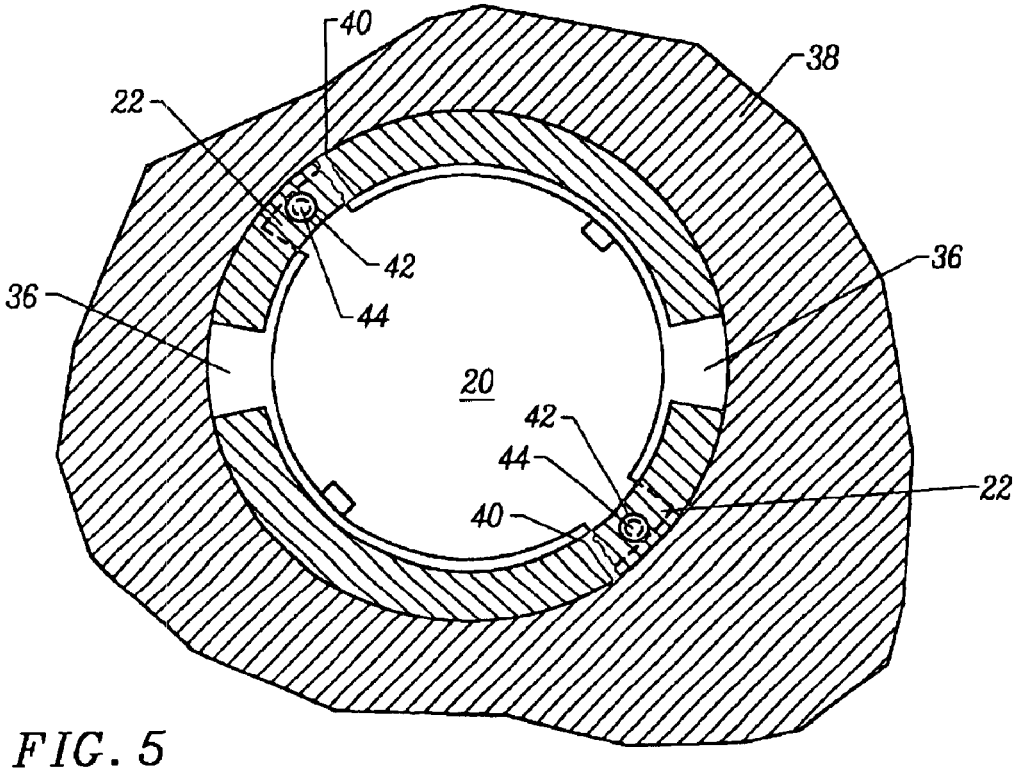
FIG. 5 is a cross-sectional view similar to that shown in FIG. 4 with the cartridge rotated into a locked position.

Referring now to FIGS. 3–5, it is understood that cartridge 20 may be secured within receptacle 26 by various known fastening configurations. However, in a preferred embodiment, a bayonet-type fastening system may be provided whereby, upon insertion of the cartridge 20 into receptacle 26, the pair of wings 22 align with their respective pair of slots 36 formed in a bottom conveyor plate 38 of the pod 28 as shown in FIG. 4. Thereafter, the cartridge 20 may be rotated as explained hereinafter until wings 22 engage a respective pair of stops 40 as shown in FIG. 5. At this point, the cartridge 20 is locked within the receptacle 26. The upper surface of conveyor plate 38 and a juxtaposed lower surface of cartridge 20 may include bumps 42 and detents 44 respectively. Upon rotation of the cartridge 20 into its locked position, the bumps 42 and detents 44 may engage each other to positively restrain the cartridge 22 in a locked position. It is understood that the positions of the bumps and detents on the conveyor plate and cartridge may be reversed in an alternative embodiment. The engagement of bumps 42 and detents 44 is sufficiently strong to prevent accidental dislodging of the cartridge 20 from receptacle 26.

Figure 6A:
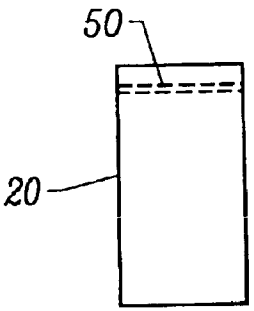
FIGS. 6A–6F illustrate schematic representations of various configurations of the interior components of a cartridge according to the present invention.
Figure 6B:
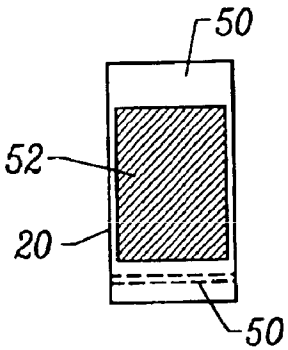
Figure 6C:
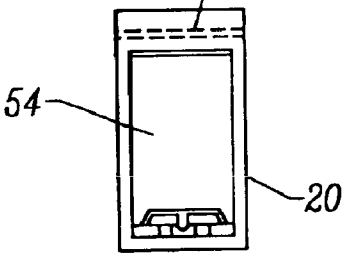
Figure 6D:
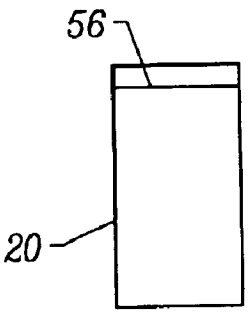
Figure 6E:
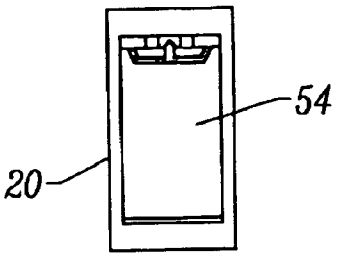
Figure 6F:
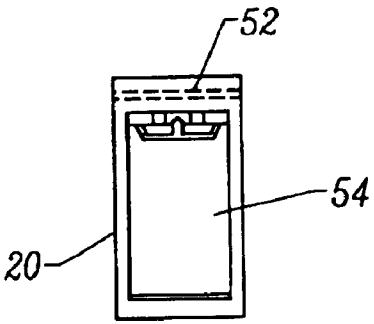

Cartridges 20 may include a wide variety of combinations of valves, filters, and/or conditioning agents. A few of these combinations are shown in FIGS. 6A–6F. As would be appreciated by those of skill in the art, any component which would normally be mounted within an inlet or outlet valve to a pod may be provided within a cartridge 20 in various configurations. FIGS. 6A–6C in general represent cartridge configurations that would be provided at the inlet valve to a pod, where gas would flow from the inlet gas lines, through the cartridge and into the pod. FIGS. 6D–6F in general comprise cartridge configurations that would be provided in an outlet valve to a pod, where gas would flow from the pod through the cartridge, and out through the low pressure gas lines. It is understood however that some of the configurations shown in FIGS. 6A–6C may be provided at a pod outlet, and that some of the configurations shown in FIGS. 6D–6F could be provided at a pod inlet in alternative embodiments of the invention. The structure and operation of the various valves and filters described hereinafter with respect to FIGS. 6A–6F would be known to those of skill in the art. Such valves and filters are shown schematically in the figures.

A first configuration of a cartridge 20 is shown in FIG. 6A, wherein the cartridge 20 includes a breather filter 50. The filter 50 may comprise a high efficiency submicron expanded TEFLON® (PTFE) membrane, but filter 50 may comprise any filter known for filtering a gas entering into a pod 28. As would be appreciated by those of skill in the art, such a valve may be provided in an inlet and/or outlet to a pod to allow the free flow of gas to and from the pod so that the pressure inside the pod matches ambient. A second configuration of a cartridge 20 is shown in FIG. 6B. As shown therein, cartridge 20 may include a filter 50 at the inlet side of cartridge 20 and may further include an adsorbent 52. Providing a breather filter 50 between the inlet flow of the gas and the adsorbent filter minimizes ambient loading of the adsorbent filter thereby prolonging the life of the adsorbent filter. It is understood however that a cartridge 20 may include an adsorbent filter 52 with a breather filter positioned either at the inlet and/or outlet to the cartridge 20, or alternatively have no breather filter at all.

Referring now to FIG. 6C, a cartridge 20 may include a breather filter 50 and a valve 54 for regulating the flow through the cartridge 20. Valve 54 may be any valve known for regulating the flow of gas into or out of a pod. For example, valve 54 may include one or more holes through a base of the valve through which gas may enter. Gas entering through the valve holes forces the edges of a cap surrounding the holes upward away from a bottom surface of the valve to thereby allow gas through the valve. Any pressure on the top side of the cap will merely press the cap down into tighter engagement with a bottom surface of the valve to thereby block fluid flow in that direction. Alternatively, the valve may include a central plunger which may be pushed upward either by the pressure of the incoming gas or by a pin mounted to the support surface. When the valve is seated on the pin, the pin pushes the plunger upward, to thereby allow fluid flow through the valve. Such a valve is disclosed in U.S. Pat. No. 4,129,145 to Wynn, previously incorporated by reference. It is understood that other types of valves may be used within a cartridge 20.

It is on occasion desirable to completely close off an inlet and/or an outlet to a pod. As such, FIG. 6D shows a cartridge 20 including a blank 56 completely blocking off fluid flow through the inlet or outlet in which this particular cartridge 20 is mounted. FIG. 6E shows a cartridge 20 including only a valve 54 mounted at an outlet to a pod. The valve 54 may act as a relief valve to vent gas from the pod when the pressure within the pod exceeds a predetermined desired limit. The cartridge shown in FIG. 6E may be modified to include one or more filters 52, as shown in FIG. 6F, and/or an adsorbent filter 52 (not shown in FIG. 6F). In addition to the various valves and filters shown in FIGS. 6A–6F, a cartridge 20 may additionally include a conditioning agent 57 as shown schematically in FIG. 3 for absorbing molecular particulates diffusing around the interior of the pod 28. As would be appreciated by those of skill in the art, a cartridge 20 may include one or more of the above-described filters, valves, and/or conditioning agents, in any combination, as desired for a particular application. It is additionally understood that cartridges 20 are not limited to the valves, filters, and/or conditioning agents disclosed herein, and that other valves, filters, and/or conditioning agents may be provided within a cartridge 20. Furthermore, a cartridge 20 may include other known components that may conventionally be located within an inlet or outlet to a pod in addition to or instead of the valves, filters, and/or conditioning agents disclosed above. Additionally, a filter may be mounted within the pod inlet and/or outlet outside of a cartridge 20 of any of the above-described configurations. Thus, no particulates or contaminants may enter the pod while the cartridge 20 is removed from the receptacle 26.

In practice, a fab may be supplied with a number of pods adapted to receive the cartridge 20 according to the present invention. Where a process requires a particular valve/filter/conditioning agent configuration, a portion of the pods may be reconfigured with the cartridge including the desired configuration. If a second process requires a second configuration, another portion of the pods may be reconfigured with the cartridge including the second desired configuration. This process may be repeated as necessary to configure the pod supply as necessary for the processes being performed within the fab. Pods configured with a cartridge for a particular process may of course be reconfigured with a different cartridge. It is also contemplated that pods including wafers may be reconfigured with a desired cartridge without having to remove the wafers from the pod.

Figure 7:
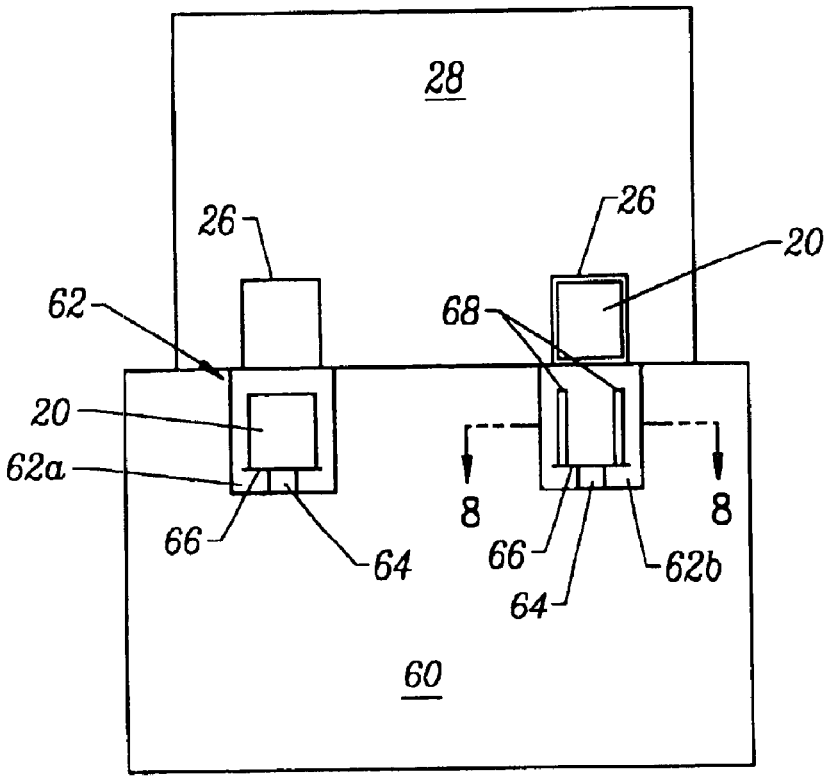
FIG. 7 is a schematic side view of a stand alone station for removing cartridges from, and inserting cartridges in, a pod.
Figure 8:
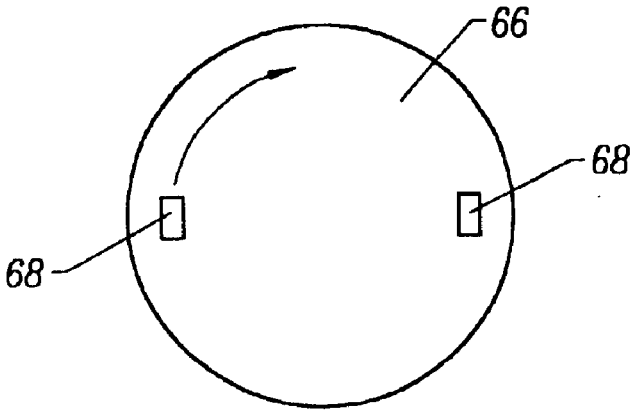
FIG. 8 is a cross sectional view through 8—8 on FIG. 7.

Referring now to FIGS. 7 and 8, a stand alone station 60 may be provided for inserting and removing the cartridges 20 from the pod 28, either while wafers are seated within the pod or the pod is empty. The station 60 may include a plurality of working spaces 62, including working spaces 62a and 62b. Although two working spaces are shown in FIG. 7, one working station may be provided for each inlet and outlet to the pod 28. Each working space includes an elevator 64 for supporting a rotating platform 66. The elevator may comprise a pair of lead screws, or some other known structure for raising and lowering the rotating platform 66. Platform 66 may include a base fixedly mounted to the elevator 64, and include a rotating surface rotatably mounted on the base by one or more bearings of known construction. Other known configurations for rotating platform 66 are contemplated.

The platform 66 may include a pair of keys 68 (shown in the working space 62b) extending upward from its surface for mating with the key slots 24 (FIGS. 1 and 2) formed in the outer housing of cartridges 20. Therefore, in order to load a cartridge into an inlet or outlet in pod 28, the desired cartridge is first loaded down into the working space so that the keys 68 fit within the key slots 24 as shown in the working space 62a in FIG. 7. The keys may insert snugly into the slots, or may alternatively translate upward and radially outward into snug engagement within the slots. Thereafter, a controller (not shown) may cause the elevator to raise the platform and cartridge into an empty receptacle 26, and rotate the platform to lock the cartridge in the pod. The elevator may recede to separate the keys 68 from the cartridge. Conversely, to remove a cartridge from an inlet or outlet in pod 28 as shown in the working space 62b in FIG. 7, the empty platform is raised so that the keys 68 engage within the key slots 24 in the cartridge locked in the pod. The platform is then rotated to unlock the cartridge, and lowered to withdraw the cartridge from the pod.

As would be appreciated, various sensors may be included as part of station 60 to indicate that the keys are properly aligned with the key slots (both upon loading of a cartridge into a working space 62, and upon removing a cartridge from the pod 28). Additionally, sensors may be provided for ensuring that the station does not attempt to load a cartridge into an inlet or outlet already containing a cartridge.

In a further embodiment (not shown) the elevator 64 in each working space may be mounted on a conveyor capable of conveying the elevator and platform laterally out past the sides of the station 60, or to another operator accessible location on station 60. In such an embodiment, a cartridge may be removed from a pod as explained above, the platform may conveyed out to the side of the station. At that point, an operator can remove the cartridge from the platform and replace another cartridge thereon, and then the conveyor may return the platform to its home position so that the new cartridge may be inserted into the pod. Such an embodiment offers the advantage that a cartridge may be removed and replaced by a new or different cartridge without having to move the pod.

Additionally and/or alternatively, a cartridge including an adsorbent may be baked out, or recharged, upon removal of the cartridge, and the cartridge including the recharged adsorbent may be replaced into that or a subsequent pod.

The station 60 may alternatively be included as part of another station within the fab. For example, the station 60 may be coupled to a cleaning station (not shown) for cleaning the interior of the pod 28. When a pod is transferred to the combination cartridge change/cleaning station, a cartridge may be removed as described above, and then the pod may be transferred to the cleaning chamber. After the cleaning process is complete, the pod may be removed from the cleaning chamber, and the same or different cartridge may be inserted back into the pod.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

I claim:

1. A SMIF pod, comprising:

a pod, having a pod shell and a pod door, said pod door forming a gas-tight seal with said pod shell, said pod having an opening;

a receptacle forming a gas-tight seal with said pod, and positioned to cover said opening in said pod; and an interchangeable modular cartridge positioned within said receptacle.

2. A system for allowing gas to flow through an opening in a pod as recited in claim 1, wherein said interchangeable modular cartridge has at least one component selected from the group consisting of (i) a valve, (ii) a filter, (iii) a conditioning agent, and (iv) a blank.

3. A system for allowing gas to flow through an opening in a pod as recited in claim 2, wherein said component comprises a breather filter.

4. A system for allowing gas to flow through an opening in a pod as recited in claim 2, wherein said component comprises an adsorbent filter.

5. A system for allowing gas to flow through an opening in a pod as recited in claim 2, wherein said component comprises a valve.

6. A system for allowing gas to flow through an opening in a pod as recited in claim 2, wherein said component comprises a conditioning agent.

7. A system for allowing gas to flow through an opening in a pod as recited in claim 2, wherein said component comprises a blank.

8. A system for allowing gas to flow through an opening in a pod as recited in claim 2, wherein said component comprises a filter and a valve.

9. A system for allowing gas to flow through an opening in a pod as recited in claim 2, wherein said component comprises a filter and a conditioning agent.

10. A system for allowing gas to flow through an opening in a pod as recited in claim 2, wherein said component comprises a valve and a conditioning agent.

11. A system for allowing gas to flow through an opening in a pod as recited in claim 2, wherein said component comprises a filter, a valve and a conditioning agent.

12. A system for allowing gas to flow through an opening in a pod as recited in claim 1, further comprising a station for inserting and/or removing said cartridge from the opening.

13. A cartridge allowing gas to flow through an opening in a SMIF pod, comprising:

an interchangeable modular cartridge forming a gas-tight seal with the pod, and positioned to cover the opening of the SMIF pod; and at least one component positioned in said modular cartridge, the component selected from a group consisting of (i) a valve, (ii) a filter, (iii) a conditioning agent, and (iv) a blank.

14. A pod as recited in claim 13, said cartridge including a pair of wings for locking said cartridge in the pod.

15. A pod as recited in claim 13, wherein the opening comprises an inlet through which the gas enters the pod.

16. A pod as recited in claim 13, wherein the opening comprises an outlet through which the gas exits the pod.

17. A cartridge allowing gas to flow through an opening in a SMIF pod, comprising:

an interchangeable modular cartridge positioned over the opening of the SMIF pod, the modular cartridge having a pair of wings for locking said cartridge to the pod; and at least one component positioned in said modular cartridge, the component selected from a group of a valve, a filter, a conditioning agent and a blank.

*18. A system comprising:*

*a wafer enclosure for receiving a plurality of wafers, the wafer enclosure comprising an enclosure portion with an opening and a door to sealingly close the opening, wherein the enclosure has a receptacle;*

*a set of cartridges configured to sealingly engage the wafer enclosure through the receptacle, wherein the set of cartridges comprise at least two different cartridges selected from the group consisting of a valve, a filter, a conditioning agent and a blank.*

*19. The system of claim 18, wherein each of the cartridges have an annular shape.*

*20. The system of claim 19, wherein each of the cartridges has a pair of wings extending from an outer surface thereof.*

*21. The system of claim 19, wherein each of the cartridges has at least one slot formed in an inner surface thereof.*

*22. The system of claim 18, and further comprising an interface seal that provides a substantially gas-tight seal between the receptacle and one of the cartridges that is attached to the wafer enclosure.*

*23. The system of claim 18, wherein each of the cartridges may be removably attached to the receptacle without removing wafers from the wafer enclosure.*

*24. The system of claim 18, wherein the receptacle is positioned on a bottom portion of the wafer enclosure.*

*25. The system of claim 24, wherein the receptacle is at least partially recessed in the bottom portion.*

*26. The system of claim 18, wherein the wafer enclosure is a SMIF pod.*

*27. A method of selectively adapting a wafer enclosure to a desired purging capability, the wafer enclosure having an enclosure portion with an opening and a door to sealingly close the opening, wherein the enclosure has a receptacle, the method comprising:*

*providing a workstation having a work space and a set of cartridges that includes at least two different cartridges selected from the group consisting of a valve, a filter, a conditioning agent and a blank*

*selecting one of the cartridges from the set of cartridges that correlates to the desired purging capability;*

*positioning the cartridge in the work space;*

*moving the cartridge into the receptacle; and*

*attaching the cartridge to the wafer enclosure through the receptacle.*

*28. The method of claim 27, wherein one of the cartridges is moved into the receptacle with an elevator.*

*29. The method of claim 27, and further comprising engaging the cartridge with a pair of keys that extend from the elevator.*

*30. The method of claim 27, wherein each of the cartridges include a pair of wings extending from an outer surface thereof, wherein the receptacle includes a pair of slots formed therein that are adapted to receive the pair of wings, and wherein the cartridge is attached to the receptacle by extending the pair of wings through the pair of slots and rotating the cartridge with respect to the receptacle.*

* * * * *